(12) United States Patent
Vellianitis

(10) Patent No.: US 10,672,889 B2
(45) Date of Patent: Jun. 2, 2020

(54) SEMICONDUCTOR DEVICE AND MANUFACTURING METHOD THEREOF

(71) Applicant: TAIWAN SEMICONDUCTOR MANUFACTURING CO., LTD., Hsinchu (TW)

(72) Inventor: Georgios Vellianitis, Heverlee (BE)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/988,496

(22) Filed: May 24, 2018

(65) Prior Publication Data

US 2019/0165140 A1 May 30, 2019

Related U.S. Application Data

(60) Provisional application No. 62/593,171, filed on Nov. 30, 2017.

(51) Int. Cl.
| | | |
|---|---|---|
| *H01L 29/66* | (2006.01) | |
| *H01L 21/02* | (2006.01) | |
| *H01L 21/8238* | (2006.01) | |
| *H01L 21/308* | (2006.01) | |
| *H01L 21/8258* | (2006.01) | |
| *H01L 27/092* | (2006.01) | |
| *H01L 21/762* | (2006.01) | |

(52) U.S. Cl.
CPC .. *H01L 29/66795* (2013.01); *H01L 21/02609* (2013.01); *H01L 21/02639* (2013.01); *H01L 21/3083* (2013.01); *H01L 21/76224* (2013.01); *H01L 21/8258* (2013.01); *H01L 21/823821* (2013.01); *H01L 21/823878* (2013.01); *H01L 27/0924* (2013.01)

(58) Field of Classification Search
CPC ....... H01L 29/66795; H01L 21/823878; H01L 21/8258; H01L 21/3083; H01L 21/76224; H01L 27/0924; H01L 21/02609; H01L 21/02639; H01L 21/823821
See application file for complete search history.

(56) References Cited

U.S. PATENT DOCUMENTS

| | | |
|---|---|---|
| 8,962,400 B2 | 2/2015 | Tsai et al. |
| 9,093,514 B2 | 7/2015 | Tsai et al. |
| 9,236,267 B2 | 1/2016 | De et al. |
| 9,245,805 B2 | 1/2016 | Yeh et al. |
| 9,418,897 B1 | 8/2016 | Ching et al. |
| 9,520,482 B1 | 12/2016 | Chang et al. |
| 9,576,814 B2 | 2/2017 | Wu et al. |
| 9,608,116 B2 | 3/2017 | Ching et al. |
| 9,812,363 B1 | 11/2017 | Liao et al. |
| 9,859,380 B2 | 1/2018 | Lee et al. |

(Continued)

*Primary Examiner* — Yasser A Abdelaziez
(74) *Attorney, Agent, or Firm* — Maschoff Brennan

(57) ABSTRACT

A method of manufacturing a semiconductor device includes forming an isolation region on a semiconductor substrate. A trench is formed in an <xyz> crystallographic direction of the semiconductor substrate in the isolation region. An epitaxial layer is grown in the trench. The epitaxial layer is patterned to form a semiconductor fin orientated along an <x'y'z'> crystallographic direction of the semiconductor substrate, wherein <x'y'z'>≠<xyz>.

20 Claims, 14 Drawing Sheets

(56) References Cited

U.S. PATENT DOCUMENTS

| | | | |
|---|---|---|---|
| 2008/0099785 A1* | 5/2008 | Bai | C30B 25/183 257/190 |
| 2011/0049568 A1* | 3/2011 | Lochtefeld | H01L 21/02381 257/190 |
| 2011/0068347 A1* | 3/2011 | Strittmatter | H01L 21/02389 257/76 |
| 2015/0311073 A1* | 10/2015 | Srinivasan | H01L 29/0684 438/504 |

* cited by examiner

SEMICONDUCTOR DEVICE AND MANUFACTURING METHOD THEREOF

PRIORITY CLAIM AND CROSS-REFERENCE

This application claims priority to U.S. Provisional Application Ser. No. 62/593,171, filed Nov. 30, 2017, which is herein incorporated by reference.

BACKGROUND

Combining the different groups of semiconductor materials in semiconductor structures will provide a range of performance benefits for various semiconductor devices formed on the semiconductor structures. However, problems arise when layering various semiconductor materials, especially between group III/V and group IV materials. Semiconductors are crystalline materials that have lattice structures. The different semiconductor groups and semiconductors within the same group may have varying lattice constants. When epitaxially growing a semiconductor material with a second lattice constant on a semiconductor material with a first lattice constant, defects may occur. Some of the defects may be threading dislocations. High threading dislocation density, stemming from large lattice mismatch, may render the semiconductor device unusable. Threading dislocations may occur when growing a crystal structure on another crystal structure with a different lattice constant. They are defects within the crystal structure itself.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1C:
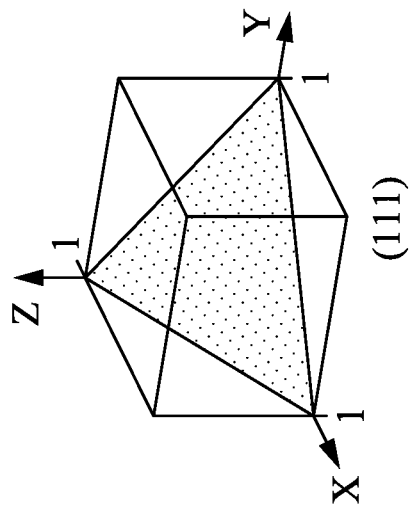
FIGS. 1(A)-1(C) are schematic diagrams showing the three types of crystalline orientation for silicon.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

Silicon (Si) is recognized as presently being the most ubiquitous semiconductor substrate for the electronics industry. Most of silicon that is used to form silicon wafers is formed from single crystal silicon. The silicon wafers serve as the substrate on which complementary metal-oxide-semiconductor (CMOS) devices are formed. In crystalline silicon, the atoms which make up the solid are arranged in a periodic fashion. If the periodic arrangement exists throughout the entire solid, the substance is defined as being formed of a single crystal. If the solid is composed of a myriad of single crystal regions the solid is referred to as polycrystalline material. As readily understood by skilled artisans, periodic arrangement of atoms in a crystal is called the lattice. The crystal lattice also contains a volume which is representative of the entire lattice and is referred to as a unit cell that is regularly repeated throughout the crystal. For example, silicon has a diamond cubic lattice structure, which can be represented as two interpenetrating face-centered cubic lattices. Thus, the simplicity of analyzing and visualizing cubic lattices can be extended to characterization of silicon crystals. In the description herein, references to various planes in silicon crystals will be made, especially to the (100), (110), and (111) planes. These planes define the orientation of the plane of silicon atoms relative to the principle crystalline axes. The numbers {xyz} are referred to as Miller indices and are determined from the reciprocals of the points at which the crystal plane of silicon intersects the principle crystalline axes.

Figure 1B:
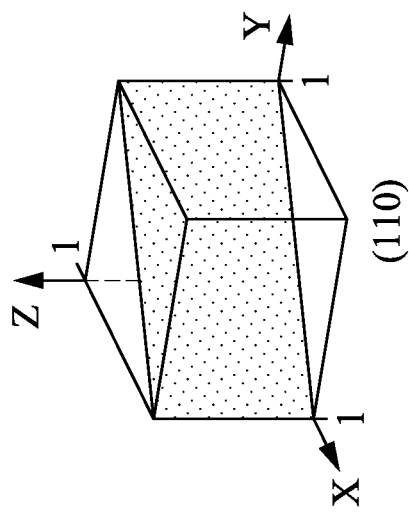
Figure 1A:
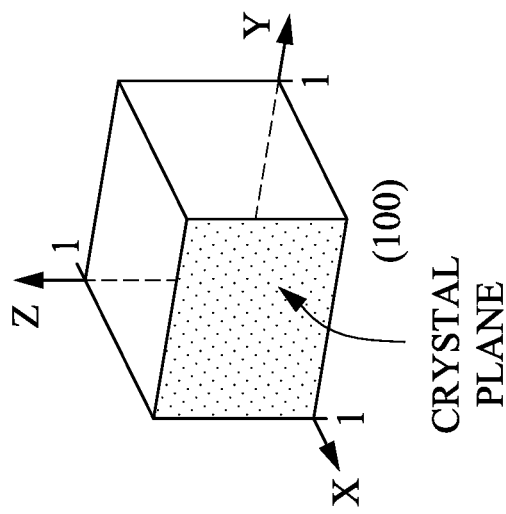

FIGS. 1(A) through 1(C) show three orientations of the crystal plane of silicon. In FIG. 1(A), the crystal plane of silicon intersects the x-axis at 1 and never intersects the y or z-axis. Therefore, the orientation of this type of crystalline silicon is (100). Similarly, FIG. 1(B) shows (110) crystalline silicon and FIG. 1(C) shows (111) silicon. The (100) orientation is the primary wafer orientation in commercial use. Notably, for any given plane in a cubic crystal there are five other equivalent planes. Thus, the six sides of the cube comprising the basic unit cell of the crystal are all considered (100) planes. The notation {xyz} refers to all six of the equivalent (xyz) planes. Throughout the description, reference will also be made to the crystal directions, especially the <100>, <110> and <111> directions. These are defined as the normal direction to the respective plane. Thus, the <100> direction is the direction normal to the (100) plane. The notation <xyz> refers to all six equivalent directions.

Figure 2:
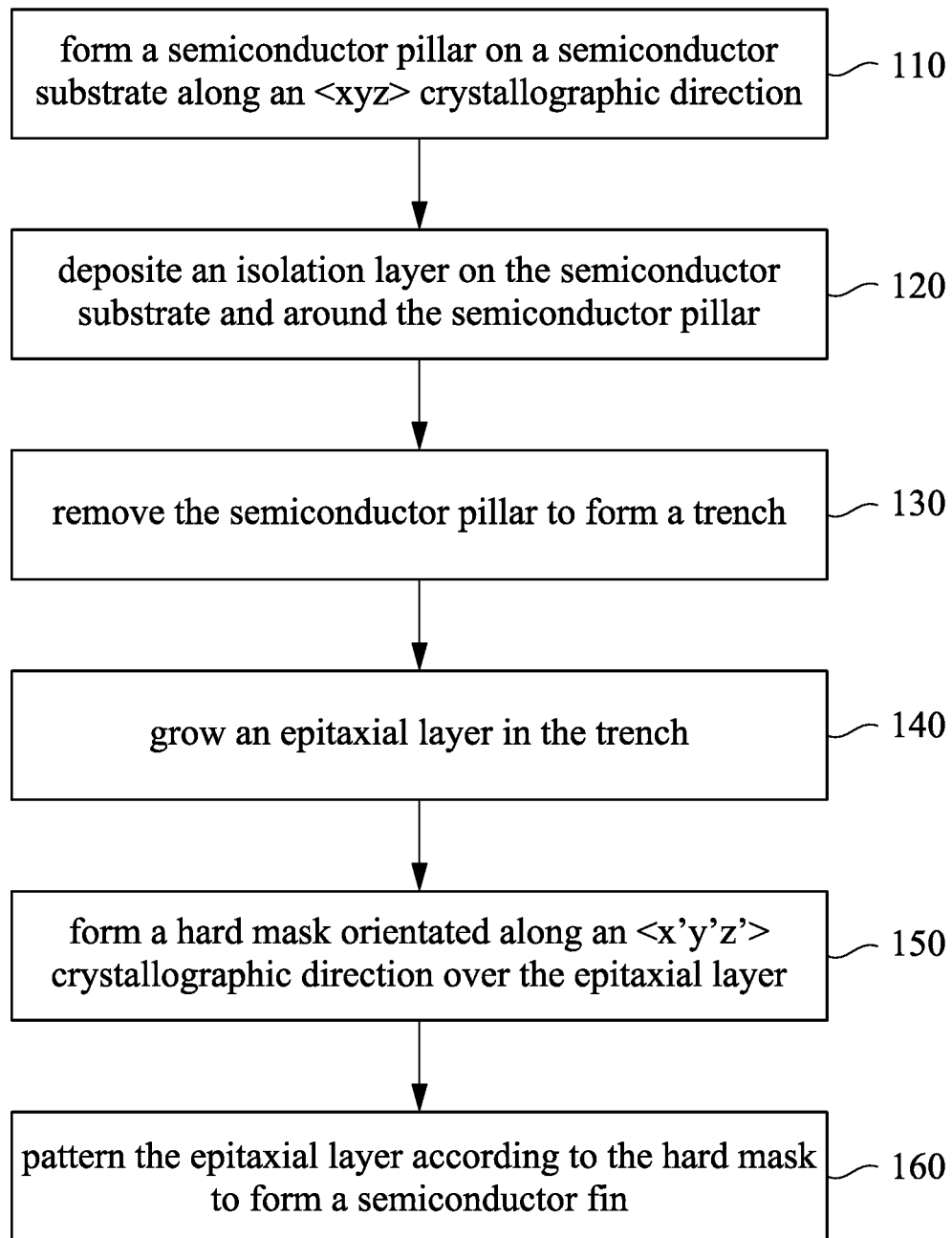
FIG. 2 is a flow chart illustrating a method of fabricating a semiconductor device in accordance with some embodiments of the instant disclosure.

Referring to FIG. 2, a flow chart of a method 100 of fabricating a semiconductor device in accordance with some embodiments of the instant disclosure. The method 100 begins with operation 110 in which a semiconductor pillar is formed on a semiconductor substrate along an <xyz> crystallographic direction. The method 100 continues with operation 120 in which an isolation layer is deposited on the semiconductor substrate and around the semiconductor pillar. Subsequently, operation 130 is performed. The semiconductor pillar is removed to form a trench. The method 100 continues with operation 140 in which an epitaxial layer is grown in the trench. The method 100 continues with operation 150 in which a hard mask orientated along an <x'y'z'> crystallographic direction is formed over the epitaxial layer. The method 100 continues with operation 160 in which the epitaxial layer is patterned according to the hard mask to form a semiconductor fin. The discussion that follows illustrates embodiments of semiconductor devices that can be fabricated according to the method 100 of FIGS. 1A-1C. While method 100 is illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

Figure 3:
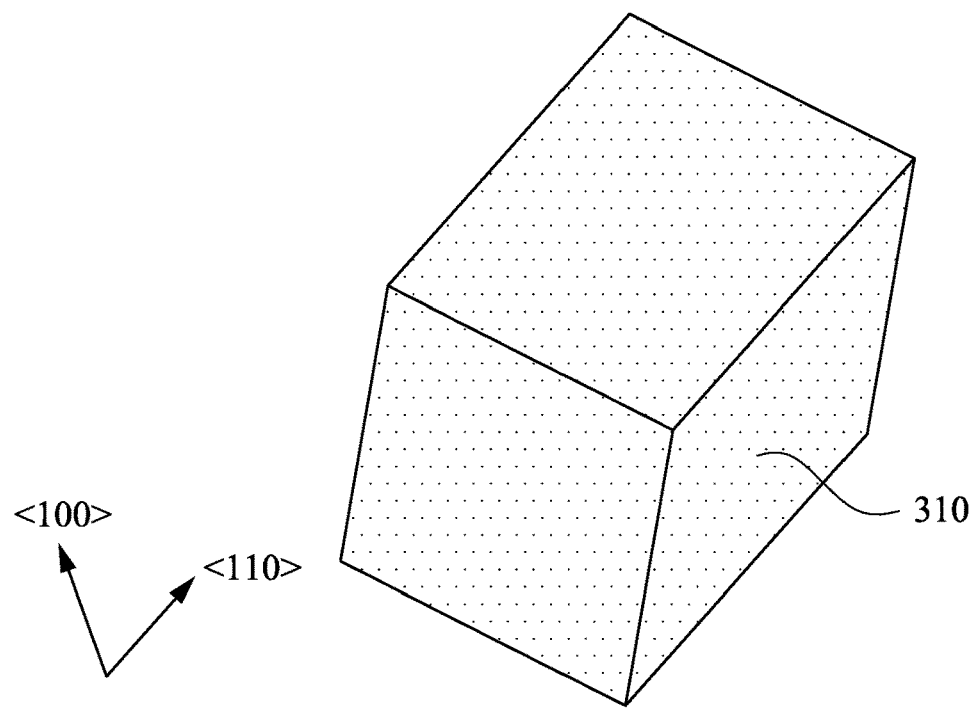
FIGS. 3-12 depict schematic perspective views in various intermediate stages of forming a semiconductor fin.

Reference is made to FIG. 3. A semiconductor substrate 310 is provided that includes a first semiconductor material, such as, for example, a group IV element, e.g., germanium or silicon. The first semiconductor material may be crystalline. The semiconductor substrate 310 may be, for example, a bulk silicon wafer, a bulk germanium wafer, a semiconductor-on-insulator (SOI) substrate, or a strained semiconductor-on-insulator (SOI) substrate. In some embodiments, the substrate 310 includes (001) silicon. The substrate 310 may include a material having a first conductivity type, e.g., n- or p-type, such as n+ Si.

Figure 4:
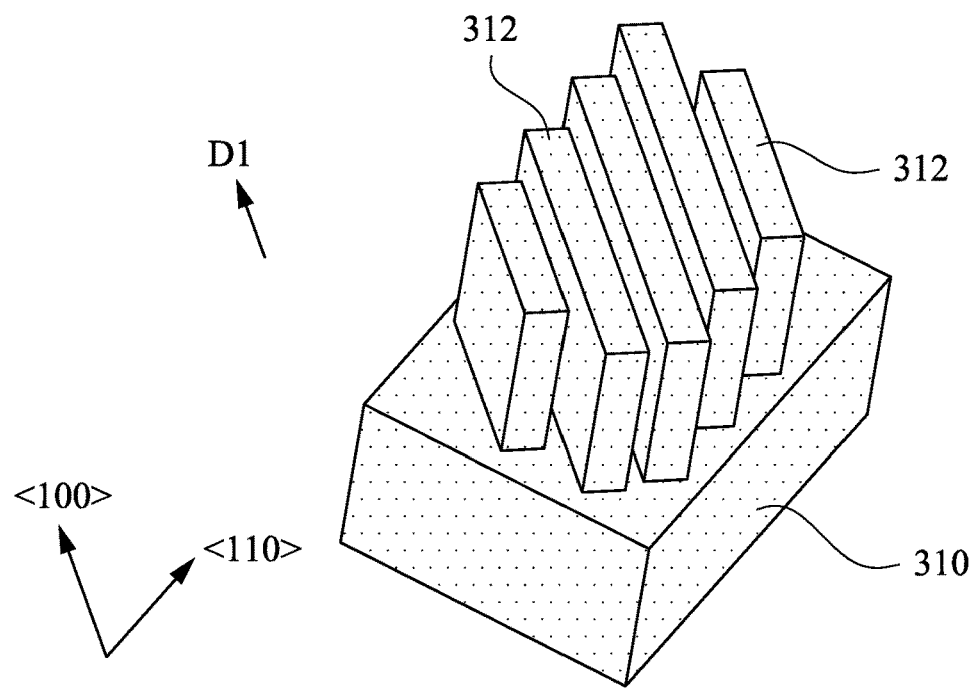

Reference is made to FIG. 4. Semiconductor pillars 312 are formed on the semiconductor substrate 310. A photolithography and patterning process may be performed to form the semiconductor pillars 312. A mask (not shown) is disposed over the semiconductor substrate 310 and developed to define the semiconductor pillars 312 extending along a first crystallographic direction D1 of the first semiconductor material. The first crystallographic direction D1 has a notation <xyz>. In some embodiments, <xyz> can be <100>. Then a positive or negative etching process is performed. At least a portion of the semiconductor pillars 312 sidewall is generally vertical, i.e. disposed at about 80 to 120 degrees to the surface of the semiconductor substrate 310. In some embodiments, the sidewalls of the semiconductor pillars 312 are substantially perpendicular to the surface of the semiconductor substrate 310. In some embodiments, the semiconductor pillars 312 are elongated rectangular bars, spanning across the surface of the semiconductor substrate 310. The semiconductor pillars 312 are spaced apart by a predetermined pitch and substantially parallel to each other as shown in FIG. 4. The length of the semiconductor pillars 312 may vary on one semiconductor substrate 310 due to the shape of the wafer. The number of the semiconductor pillars 312 may vary depending on design choice.

Figure 5:
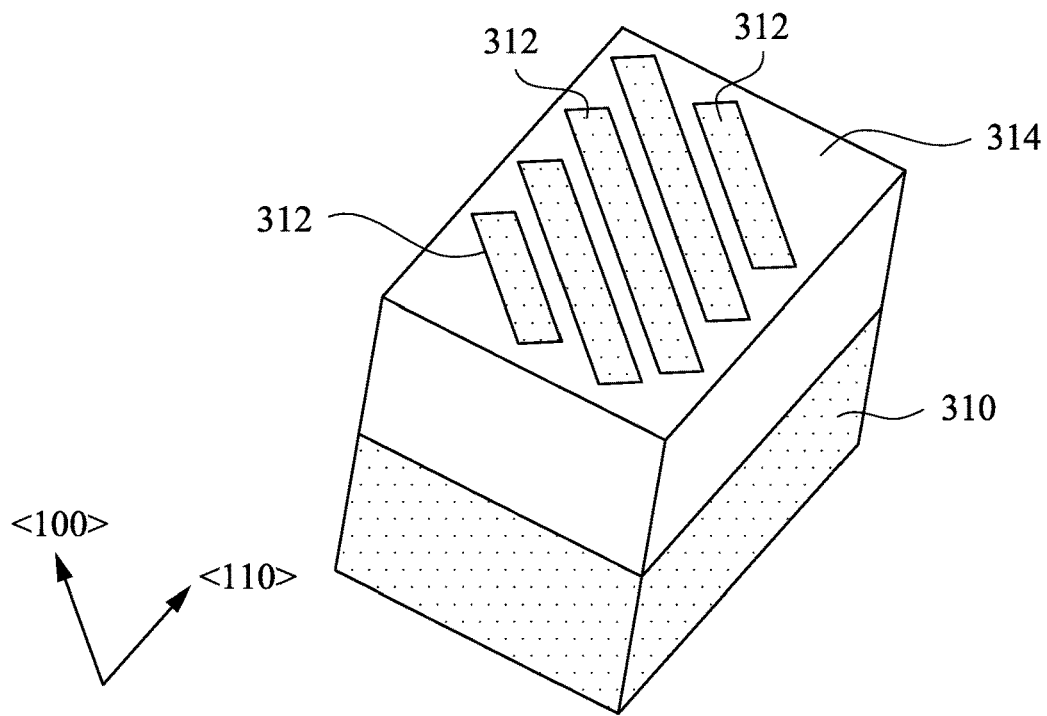

Reference is made to FIG. 5. An isolation region 314 is formed. A dielectric material is blanket deposited over the semiconductor substrate 310 and covers up the semiconductor pillars 312. In some embodiments, the dielectric material includes un-doped oxide material, for example, $SiO_2$. The formation of isolation region 314 may be performed using high-density plasma chemical vapor deposition (HDPCVD). Other suitable methods, such as sub-atmospheric CVD (SACVD) and spin-on can also be used. A chemical mechanical polish (CMP) is then performed to remove excess dielectric material until the underlying semiconductor pillars 312 are exposed. The semiconductor pillars 312 may be seen as the active region surrounded by the isolation region 314 on the semiconductor substrate 310.

Figure 6:
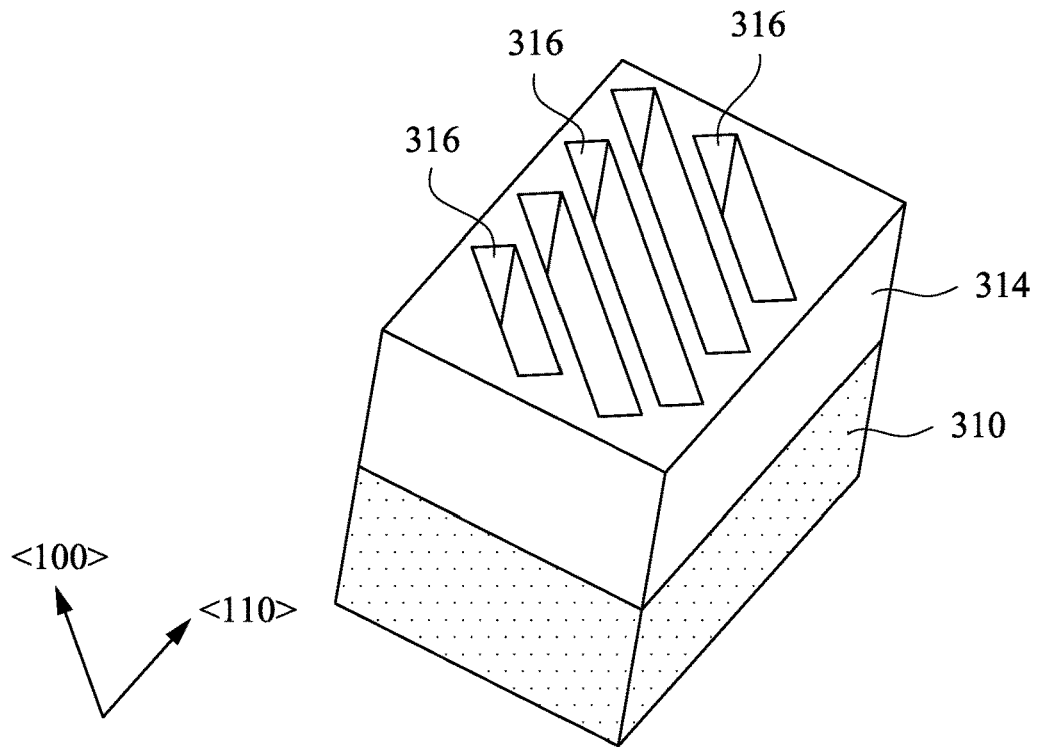

Reference is made to FIG. 6. The semiconductor pillars 312 are removed. The semiconductor pillars 312 are orientated along <100> crystallographic direction of the first semiconductor material. When the semiconductor pillars 312 of FIG. 4 are removed by, for example, dry etching, trenches 316 are formed in the isolation region 314. These trenches 316 retain the bar-like shapegoing along the <100> crystallographic direction over the semiconductor substrate 310. Sidewalls of the trenches 316 inherit the geometrical property of the semiconductor pillars 312. The trenches are used as a mold to grow an epitaxial layer in the subsequent process. In some embodiments, the trenches 316 are sufficiently deep so as to fulfil the geometrical conditions in aspect-ratio-trapping (ART). In some embodiments, the height of the isolation region 314 is equivalent to the height of the trenches 316. That is, the trenches 316 expose the semiconductor substrate 310. In some embodiments, the semiconductor pillars 312 are partially removed and portions thereof remain at the bottom of the trenches 316. In that case, the height of the isolation region 314 is larger than the height of the trenches 316. In some embodiments, the trenches 316 have a depth of about 120 nm.

Figure 7:
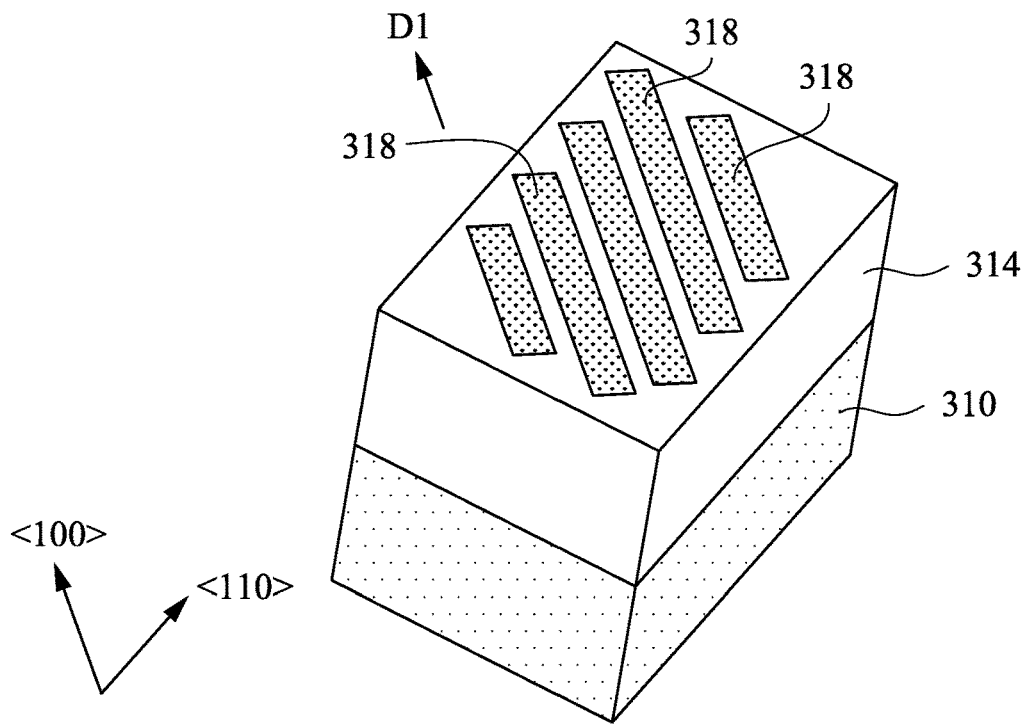

Reference is made to FIG. 7. An epitaxial layer 318 is formed in the trenches 316. The isolation region 314, as described below in greater detail, is used as a dislocation-blocking mask. The epitaxial layer 318 that includes a second semiconductor material is deposited in the trenches 316. The epitaxial layer may be formed in the opening by selective epitaxial growth in any suitable epitaxial deposition system, including, but not limited to, atmospheric-pressure CVD (APCVD), low- (or reduced-) pressure CVD (LPCVD), ultra-high-vacuum CVD (UHVCVD), by molecular beam epitaxy (MBE), or by atomic layer deposition (ALD). In the CVD process, selective epitaxial growth typically includes introducing a source gas into the chamber. The source gas may include at least one precursor gas and a carrier gas, such as, for example hydrogen. The reactor chamber is heated, such as, for example, by RF-heating. The growth temperature in the chamber ranges from about 300° C. to about 900° C. depending on the composition of the regrowth layer. The growth system may utilize low-energy plasma to enhance the layer growth kinetics. If the epitaxial material excesses the trenches 316, a planarization process (such as a CMP process) can be performed to remove the excess epitaxial material.

In some embodiments, the first semiconductor material may include silicon or a silicon germanium alloy. The second semiconductor material may include a group III, a group IV, a group V, and/or combinations thereof, for example, selected from the group consisting of germanium, silicon germanium, gallium arsenide, aluminium antimonide, indium aluminium antimonide, indium antimonide, indium arsenide, indium phosphide, and gallium nitride. In some embodiments, the first semiconductor material is silicon and the second semiconductor material is silicon germanium. Since the material of the semiconductor substrate 310 is different from that of the epitaxial layer 318, the epitaxial process can be referred to as heteroepitaxy.

Figure 13:
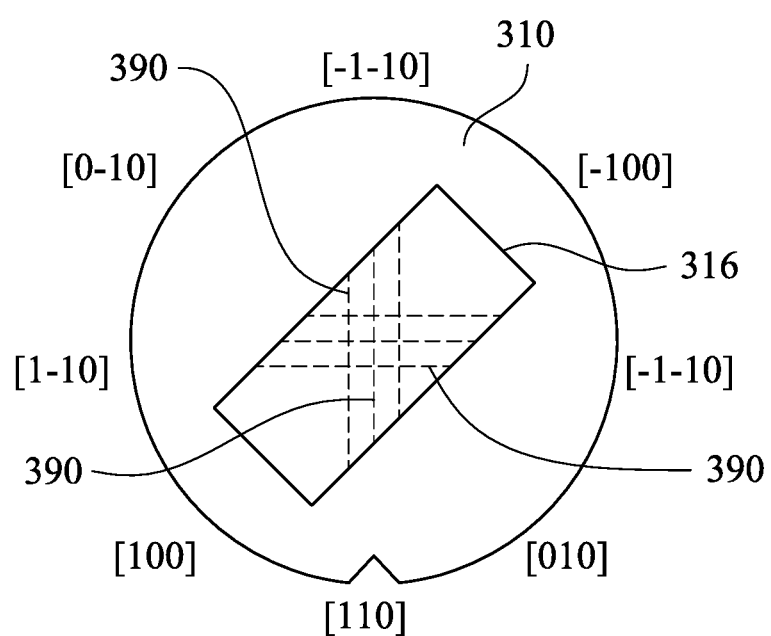
FIG. 13 depicts a schematic view of a semiconductor wafer and a trench.

Reference is made to FIG. 13. When fabricating semiconductor heterostructures, substrate interface defects occurs in a variety of lattice-mismatched materials systems. Metal oxide semiconductor (MOS) transistors are typically fabricated on (100) silicon wafers with the gates oriented such that current flows parallel to the <110> directions. In FIG. 13, dotted lines represent the threading dislocations 390 that are generated during epitaxial growth along <111> family, including [111], [-111], [-1-11], and [-1-1-1] crystallographic directions. The term "threading dislocation" refers to dislocations originating from a substrate and propagating into the epitaxial layers above it, colloquially it refers to dislocations inclined to the plane of the substrate and propagating through the epitaxial layer at some non-normal angle to the growth axis. The term "threading dislocation" will be used in its colloquial sense hereinafter.

The semiconductor substrate 310 is schematically shown as a standard wafer with a notch at [110] orientation. The trenches 316 does not align with the [110] orientation but tilts approximately 45 degrees to the notch along the [100] orientation. The <100> crystallographic direction enables confinement of the <111> crystallographic direction family threading dislocations 390. Because of the configuration of the underlying semiconductor surface, orientation of the threading dislocations 390 in the heteroepitaxial region (i.e., in the trenches 316) is at approximately 54 degrees to the surface of the semiconductor substrate 310. The vertical sidewalls of the trenches 316 (i.e., isolation region 314) facilitate trapping of the threading dislocations 390, which develop into [111], [-111], [-1-11], and [-1-1-1] orientations, as shown in FIG. 13.

Figure 8:
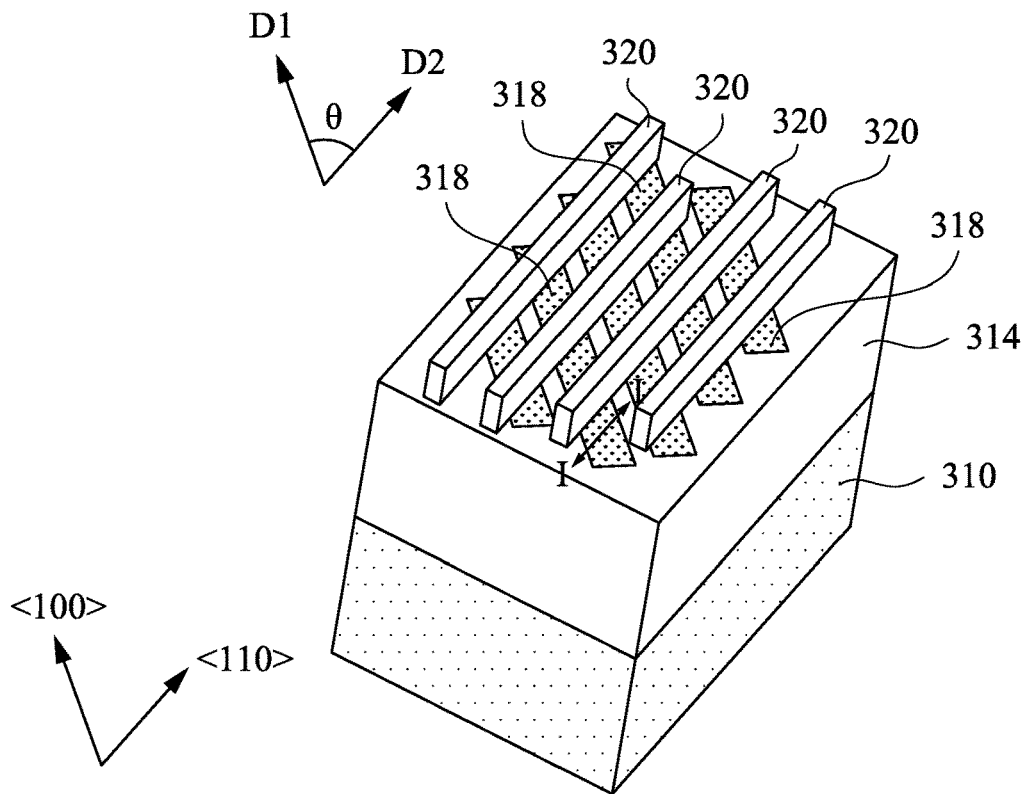

Reference is made to FIG. 8. A hard mask 320 is disposed on the isolation region 314. A photolithography and etching process may be performed to form the hard mask 320 into a plurality of separate strips that are arranged along a second crystallographic direction D2 of the first semiconductor material. The second crystallographic direction D2 has a notation <x'y'z'> different from the notation <xyz> mentioned above. In some embodiments, <x'y'z'> can be <110>. Therefore, an angle θ is formed between the first direction D1 and the second direction D2. In some embodiments, the angle θ is an acute angle. In some embodiments, the angle θ is in a range from about 40 degrees to about 50 degrees. For example, the angle θ is about 45 degrees. If the angle θ is out of the range (i.e., about 40 degrees to about 50 degrees), the height of the epitaxial layer 318 (also the semiconductor fins 318' in FIG. 9) is increased to capture the defects, such that the size of the device is increased. The pitch between the strips is predetermined. The hard mask 320 contains a dielectric material that has a distinguishable etching rate from the epitaxial layer 318. The strips of the hard mask 320 span across the top surface of the epitaxial layer 318. The strips of the hard mask 320 have a width smaller than the width of each of the bar-like epitaxial layer 318, leaving portions of the epitaxial layer 318 exposed from the hard mask 320 as shown in FIG. 8.

Figure 9:
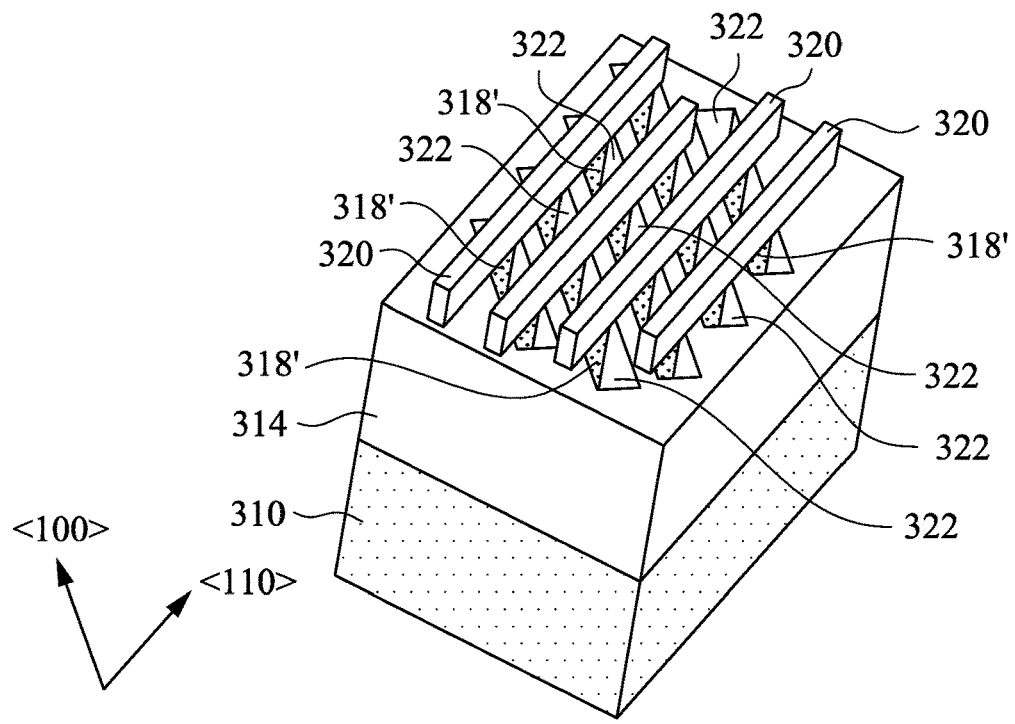

Reference is made to FIG. 9. A portion of the epitaxial layer 318 is removed. After the patterning of the hard mask 320, the underlying epitaxial layer 318 is partially removed according to the pattern of the hard mask 320. In some embodiments, the exposed (i.e., not covered by the hard mask 320) portions of the epitaxial layer 318 is removed during an etching process, leaving voids 322 between the patterned epitaxial layers 318'. The epitaxial layer 318 has a distinguishable etching rate from the isolation region 314 and the hard mask 320. An etching selectivity is shown among the isolation region 314, the epitaxial layer 318, and the hard mask 320.

Figure 10:
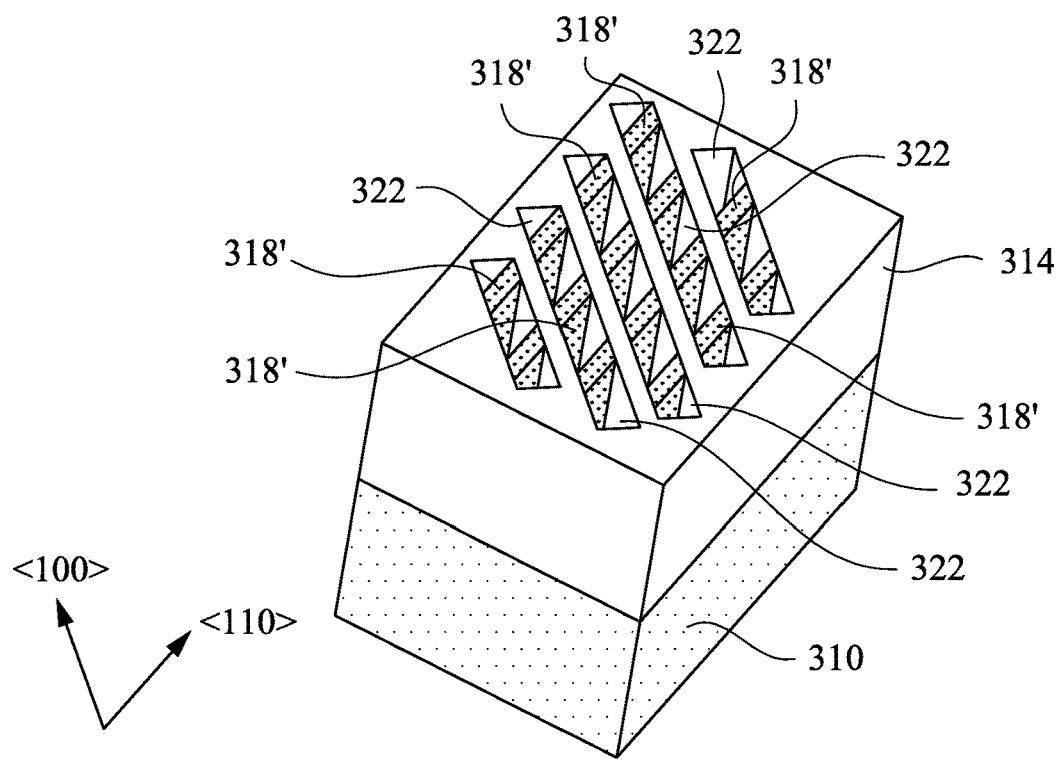

Reference is made to FIG. 10. The hard mask 320 of FIG. 9 is removed from the surface of the isolation region 314. The hard mask 320 may be removed by wet stripping and/or plasma ashing. The thin strip configuration of the hard mask 320 is translated to the underlying epitaxial layer 318, and the patterned, segmented patterned epitaxial layers 318' are substantially aligned to each other along the <110> crystallographic direction. After the patterning, the trenches 316 re-emerge and divided by the patterned epitaxial layers 318' into different compartments (i.e., voids 322). The interlaced pattern created between the trenches 316 and the patterned epitaxial layers 318' arises from the different crystallographic directions. The trenches 316 remain in <100> crystallographic direction, while the patterned epitaxial layers 318' are transformed from the <100> crystallographic direction to the <110> crystallographic direction. The offset arrangement creates discrete patterned epitaxial layers 318' in one trench 316. Within one trench 316, voids 322 are interposed between the patterned epitaxial layers 318'.

Figure 11:
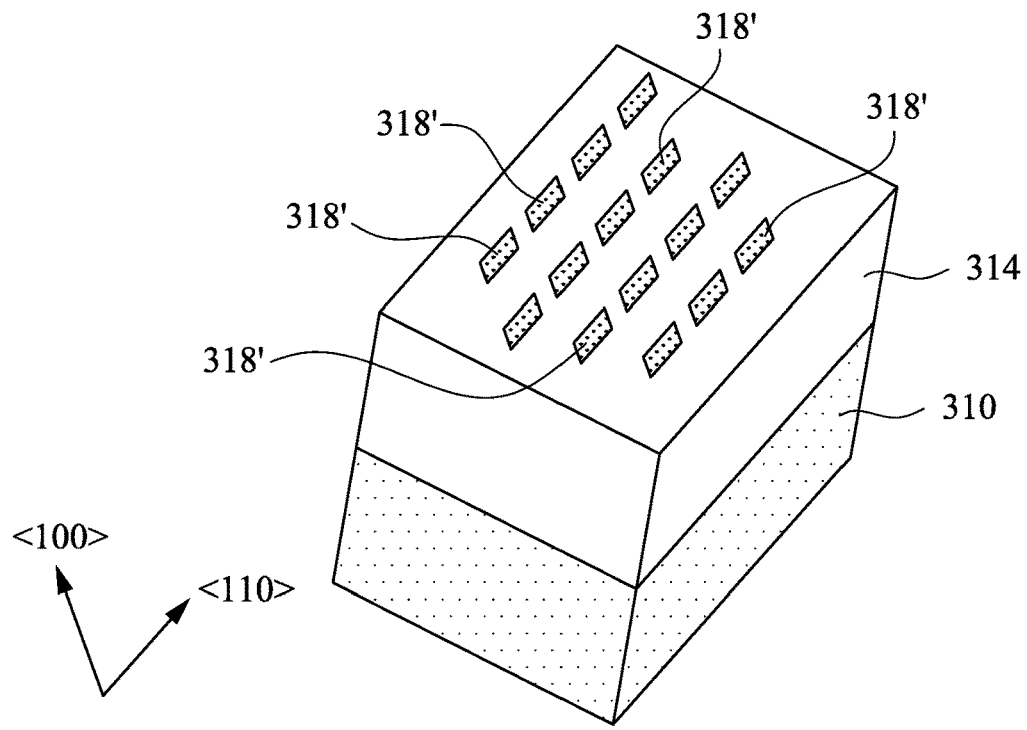

Reference is made to FIG. 11. The voids 322 are then filled with a dielectric material. The dielectric material may overfill the surface of the isolation region 314, and a planarization process is performed to expose the patterned epitaxial layers 318'. In some embodiments, the dielectric material may be the same as the dielectric material used in the isolation region 314. In some embodiments, the dielectric material may be different from that of the isolation region 314. The trenches 316 in the <100> crystallographic direction cease to exist on the semiconductor substrate 310. The isolation region 314 retains and bears the patterned epitaxial layers 318' in <110> crystallographic direction on the semiconductor substrate 310.

Figure 12:
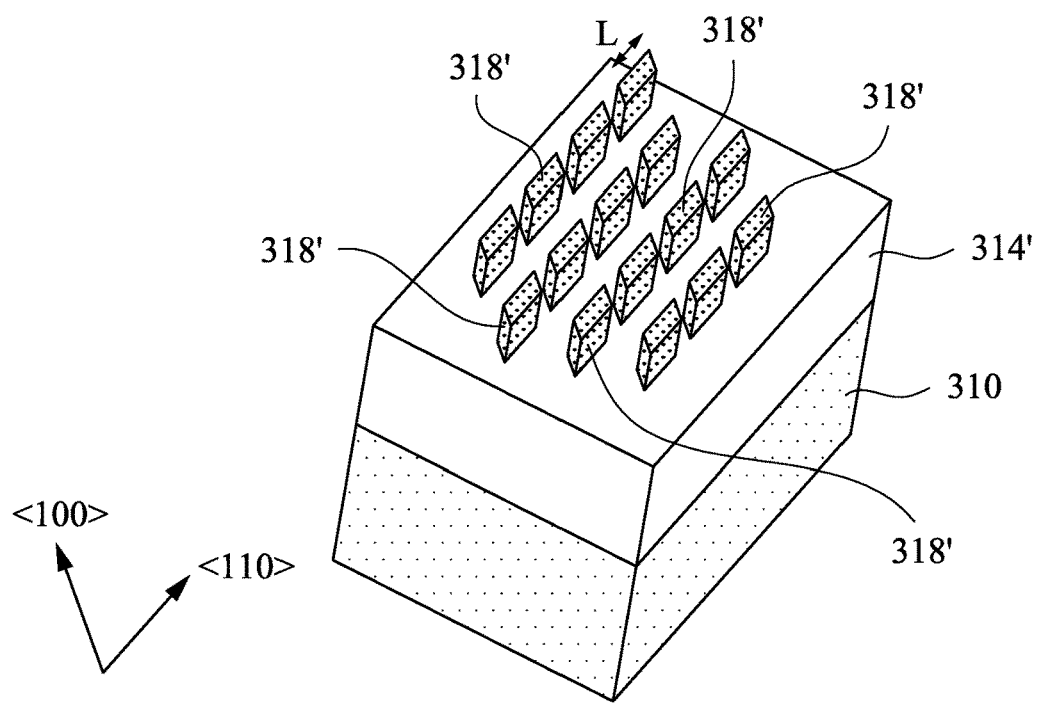

Reference is made to FIG. 12. An isolation region 314' recessing process is performed. The patterned epitaxial layers 318' protrude from the recessed surface of the isolation region 314'. An upper portion of the patterned epitaxial layers 318' re-emerge as semiconductor fins. These patterned epitaxial layers 318' are orientated toward the <110> crystallographic direction, while the formation process allows the lattice structure of the patterned epitaxial layers 318' to be orientated toward the <100> crystallographic direction. The <100> crystallographic direction effectively confines <111> family threading dislocations when the epitaxial layer 318 is grown in the trenches 316. The epitaxial layer 318 is then transformed from the <100> crystallographic direction to the <110> crystallographic direction through the hard mask 320 patterning process. The patterned epitaxial layers 318' (semiconductor fins) have a lattice structure that ensures <111> family defect confinement and suitable for semiconductor device processing.

In some embodiments, the patterned epitaxial layers 318' are aligned along the <110> crystallographic direction in a column and offset to each other in respect to the row direction. As shown in FIG. 12, the patterned epitaxial layers 318' in the first column are offset from the patterned epitaxial layers 318' in the second column. This offsetting pattern arises from the arrangement of the hard masks 320.

Figure 14:
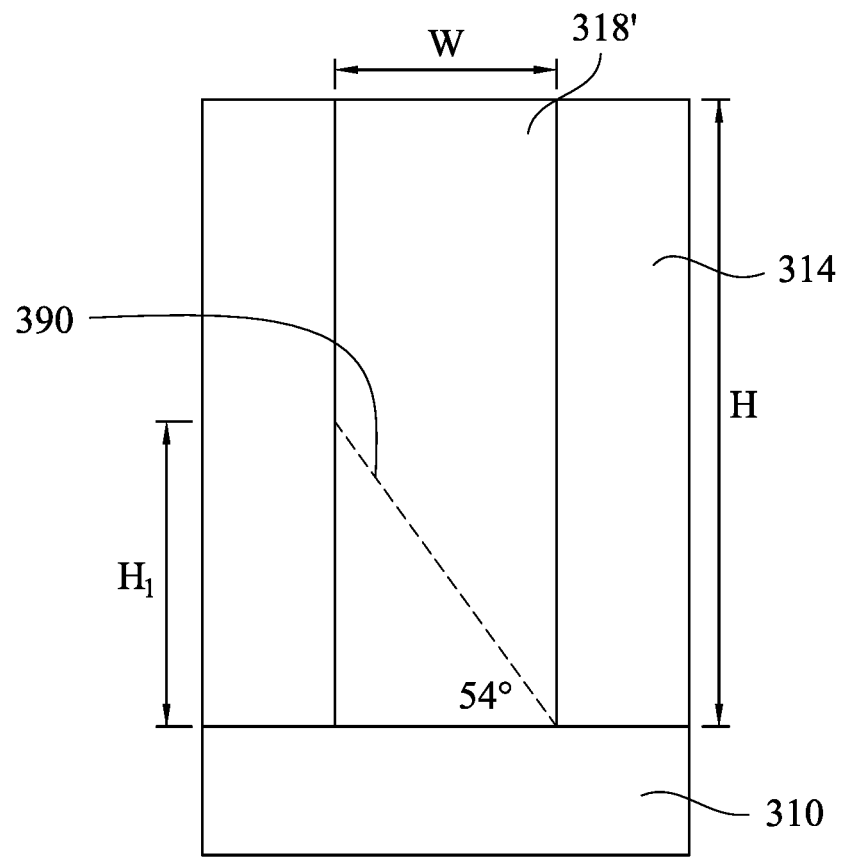
FIG. 14 depicts a cross-sectional schematic view along line I-I in FIG. 8.

The isolation region 314 recessing process also has a pivotal effect to maintain the patterned epitaxial layers 318' (semiconductor fins)<111> family defect free. Reference is made to FIG. 14, illustrating a cross-sectional view along line I-I in FIG. 8. The epitaxial layer 318 is patterned into segmented strip orientated toward the <110> crystallographic direction. The depth of the trench 316 is similar to the height (thickness) of the patterned epitaxial layer 318'. As shown in FIG. 14, the height H of the patterned epitaxial layer 318' is measured from the top surface of the semiconductor substrate 310 to the top surface of the patterned epitaxial layer 318'. The height $H_1$ is the minimum sidewall height that is capable to trap the <111> family threading dislocations. In some embodiments, the height $H_1$ of the patterned epitaxial layer 318' is about 120 nm±10%. The semiconductor fin, which protrudes over the surface of the isolation region 314 and does not contain any <111> family threading dislocations 390 which may be 54 degree inclined to the plane of the substrate 310, has a height of about 70 nm. After subtraction (120 nm-70 nm), about 50 nm of height $H_1$ of the patterned epitaxial layer 318' is enclosed by the sidewalls of the isolation region 314 so as to trap the threading dislocations. The minimum width W of the patterned epitaxial layer 318' is measured along a direction substantially perpendicular to the <110> crystallographic direction, and the maximum width W satisfies the following equation:

$$H_1 = \tan(54°) \times W$$

Alternatively, the maximum width W can be expressed as the follow:

$$W = \frac{H_1}{1.38}$$

When the height $H_1$ is about 50 nm, it gives the maximum width W of the patterned epitaxial layer 318' of about 36 nm.

Reference is made to FIG. 12 again. Each of the patterned epitaxial layers 318' has a maximum length L measured along the <110> crystallographic direction. The length of one patterned epitaxial layer 318' satisfies the following equation:

$$L = W \times \sqrt{2}$$

The maximum length L is equal to the maximum width W times square root of 2. In some embodiments, when the width W is about 36 nm, the length L is about 51 nm (L=36×√2). The length L of the patterned epitaxial layers 318' is related to the width W, and the width W is determined by the height $H_1$. The dimension of the patterned epitaxial layers 318' is guarded by the abovementioned equations.

Figure 15:
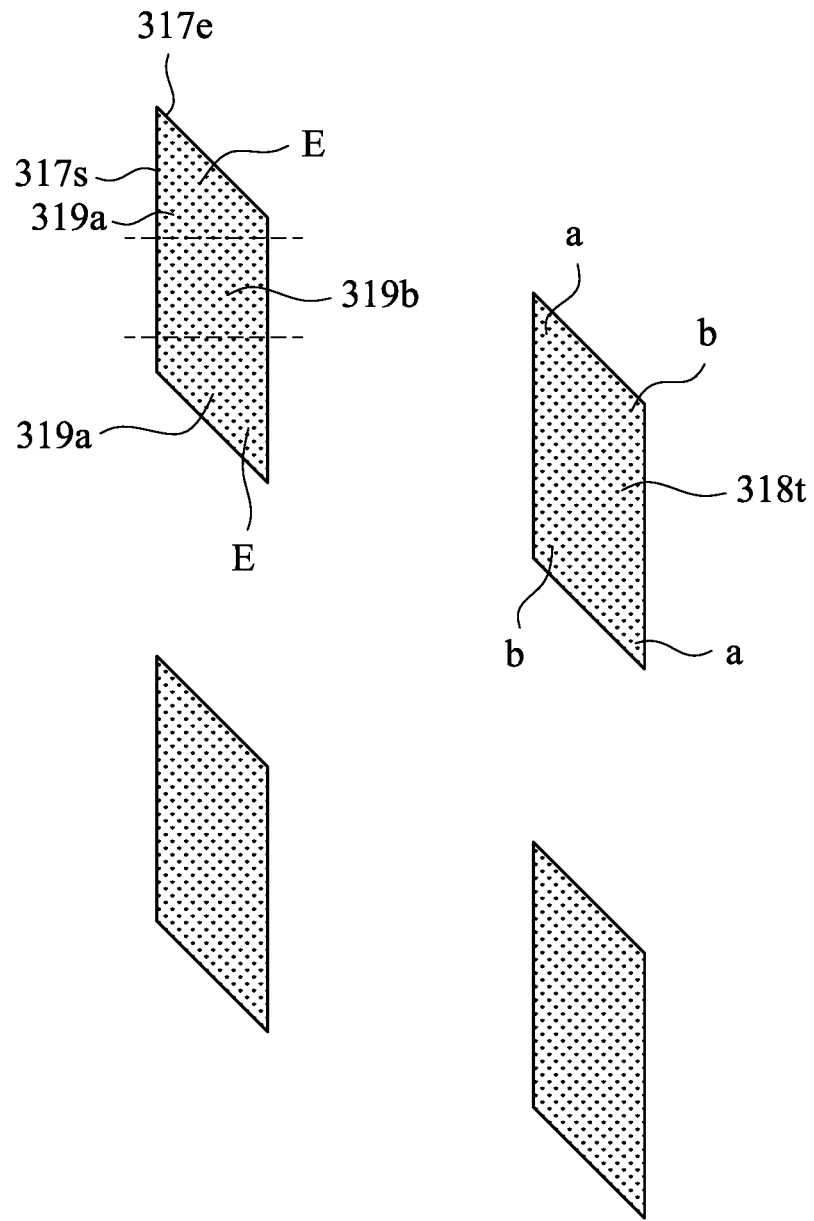
FIG. 15 depicts a local top view of the semiconductor fins of FIG. 12.

FIG. 15 is a local top view of the semiconductor fins 318' of FIG. 12. The semiconductor fin 318' has a parallelogram top surface 318t and a parallelogram bottom surface (i.e., the interface between the semiconductor fin 318' and the semiconductor substrate 310. The parallelogram top surface 318t has two acute interior angles a and two obtuse interior angles b. The acute interior angle a is in a range from about 40 degrees to about 50 degrees, and the obtuse interior angle b is in a range from about 130 degrees to about 140 degrees. For example, the acute angle a is about 45 degrees, and the obtuse interior angle b is about 135 degrees. Also, the parallelogram bottom surface have two acute interior angles a and two obtuse interior angles b. The shape of the parallelogram bottom surface is substantially the same as or similar to the shape the parallelogram top surface 318t shown in FIG. 15. The semiconductor fin 318' has source/drain regions 319a and a channel region 319b between the source/drain regions 319a. The channel region 319b is a region where a gate structure will be formed thereon, and the gate structure is not formed on the source/drain regions 319a (e.g., the gate structure 452 and the semiconductor fin 422 of FIG. 16B). At least one of the source/drain regions 319a has a tapered end E tapered away from the channel region 319b. For example, the source/drain regions 319a respectively have tapered ends E tapered away from the channel region 319b. Also, the tapered end E of one of the source/drain regions 319a is tapered away from another of the source/drain regions 319a. The semiconductor fin 318' has two opposite sidewalls 317s and two opposite end walls 317e. A sidewall 317s and an end wall 317e of the semiconductor fin 318' form the tapered end E. Also, another sidewall 317s and another end wall 317e of the semiconductor fin 318' form another tapered end E. The acute interior angle a is formed between the sidewall 317s and the end wall 317e of the semiconductor fin 318'.

Figure 16A:
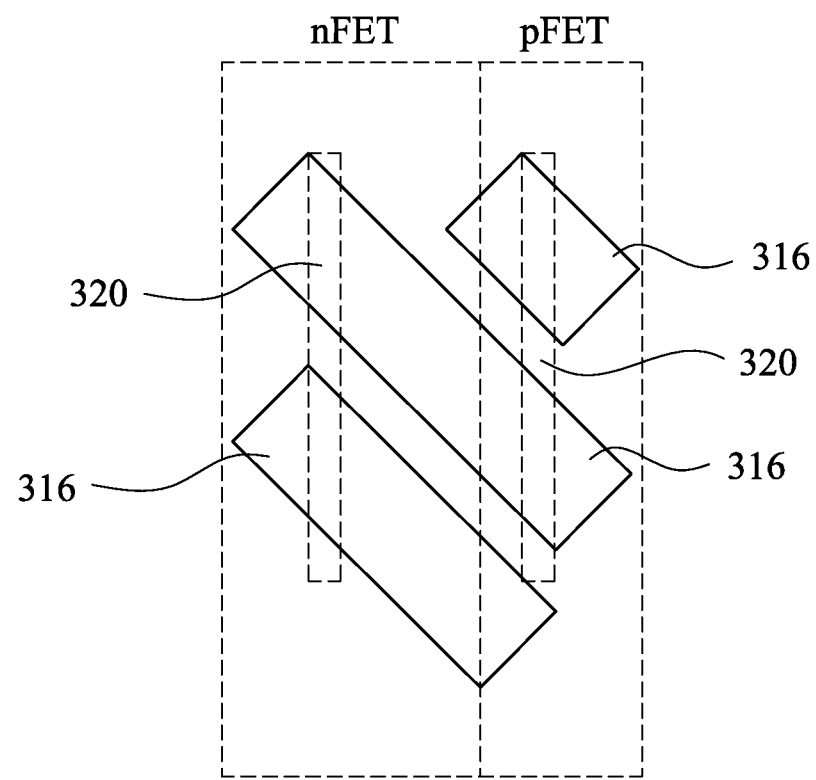
FIGS. 16A-16C depict schematic simplified structure of a semiconductor device.
Figure 16B:
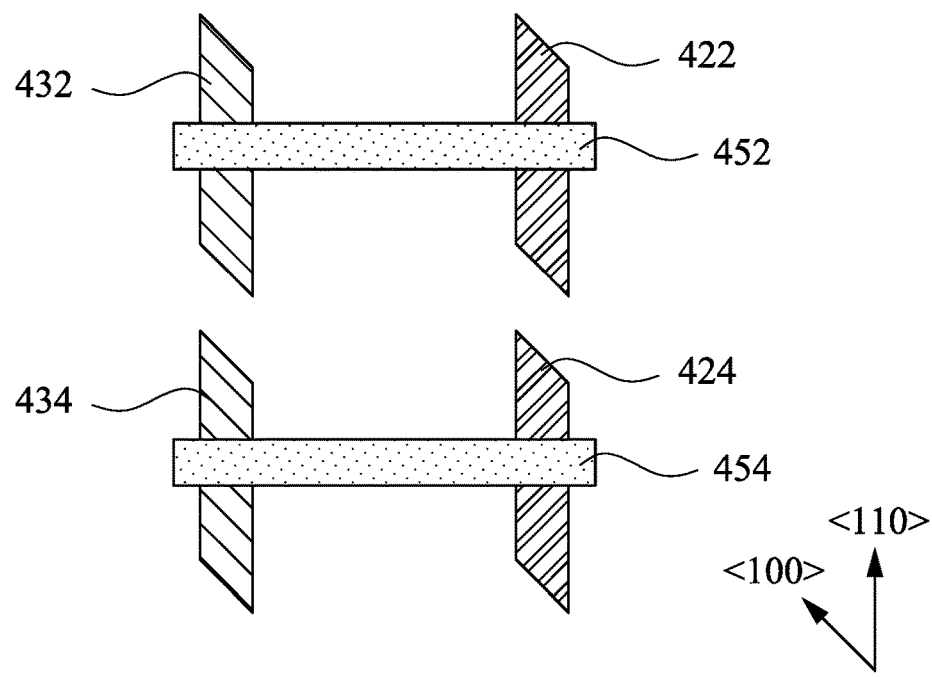
Figure 16C:
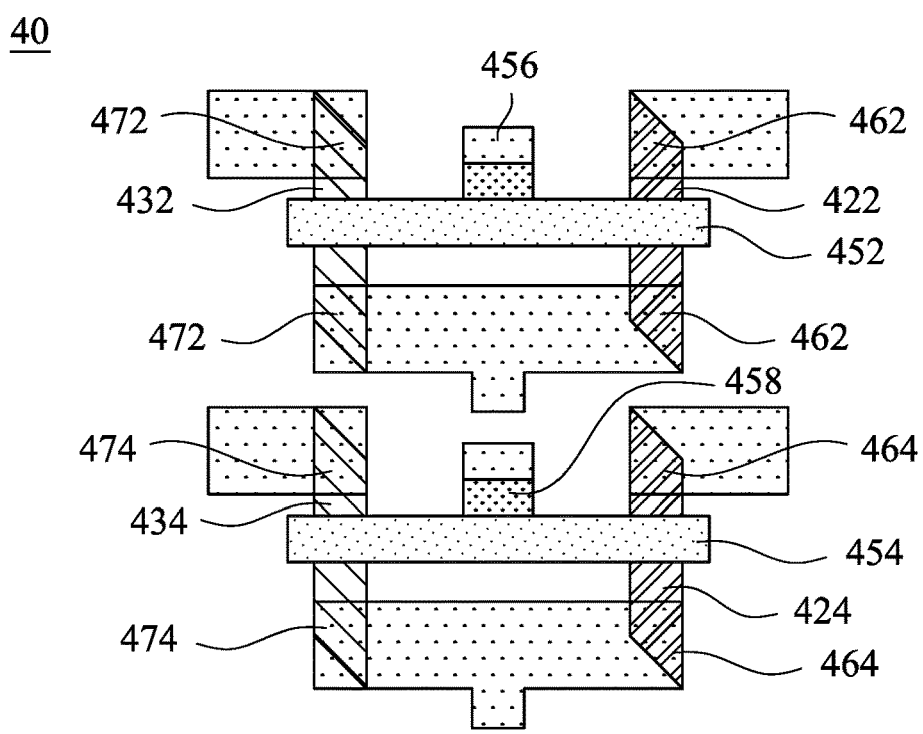

The patterned epitaxial layers 318' may be then fabricated into different semiconductor devices. Reference is made to FIGS. 16A through 16C, illustrating the transition from the patterned epitaxial layers to two inverters 40. FIG. 16A is a schematic diagram showing the relationship between the trenches 316 and the hard mask 320. The trenches 316 and the hard masks 320 are arranged in a fashion that allows the resulting patterned epitaxial layers 318' to be in alignment in rows and in column. The arrangement of the trenches 316 arises from the configuration of the semiconductor pillars 312 as shown in FIG. 4. In some embodiments, an n-FET region and a p-FET region are arranged side by side as shown in FIG. 16A. Each of the hard masks 320 spans across two of the trenches 316, and therefore creating four semiconductor fins, two for each of the n-FET and p-FET regions. The two n-FETs and two p-FETs are made into two inverters 40.

Reference is made to FIG. 16B, illustrating a schematic diagram of the n-FETs and p-FETs. Two sets of semiconductor fins are yielded after the patterning process shown in FIG. 16A. The semiconductor fins (patterned epitaxial layers) are orientated to the <110> crystallographic direction suitable for subsequent fabrication process and aligned both in row and in column. The semiconductor fins 422 and 424 are originated from the hard mask 320 at the p-FET region, and the semiconductor fins 432 and 434 are originated from the hard mask 320 at the n-FET region. The semiconductor fins 422 and 424 are arranged along the <110> crystallographic direction, and the semiconductor fins 432 and 434 are arranged along the <110> crystallographic direction. The semiconductor fins 432 and 424 are arranged along the <100> crystallographic direction. That is, the semiconductor fins 432 and 424 are patterned from the same strip of the semiconductor pillar 312 (see FIG. 4). The semiconductor fins 422 and 432 are a pair of neighbouring p-FinFET and n-FinFET. The semiconductor fins 424 and 434 are also a pair of neighbouring p-FinFET and n-FinFET. A gate structure 452 is formed across the semiconductor fins 422 and 432. A gate structure 454 is formed across the semiconductor fins 424 and 434. The gate structures 452 and 454 may be formed by gate first or gate last process. In some embodiments, in the gate last process, a dummy gate is disposed over the semiconductor fins 422, 424, 432, and 434. After source and drain regions are formed, the dummy gate is removed, and a high-k dielectric layer, a barrier layer, a work function metal layer, and a metal gate electrode are then deposited to form a high-k metal gate.

Reference is made to FIG. 16C. Source and drain regions 462, 464, 472, and 474 are formed. The source and drain regions 462, 464, 472, and 474 are formed on either side of the semiconductor fins 422, 424, 432, and 434. Contact plugs 456 and 458 are formed over the gate structures 452 and 454 for electrical connection. The semiconductor fins (patterned epitaxial layers) 422, 424, 432, and 434 are then transformed into two adjacent inverters 40.

Due to rapid growth in use and applications of digital information technology, there are demands to continuingly increase the memory density of memory devices while maintaining, if not reducing, the size of the devices. Memory cells having increased capacity and smaller critical dimensions are greatly sought after. Stacks of memory cells may include phase change materials, switching diodes, charge storage structures (e.g., floating gate structures, charge traps, tunneling dielectrics), a stack of alternating control gate structures and dielectric materials, and charge blocking materials between the charge storage structures and adjacent control gate structures. The semiconductor fins fabricated according to the abovementioned process ensures <111> family threading dislocations free and a solid structure foundation.

Figure 17A:
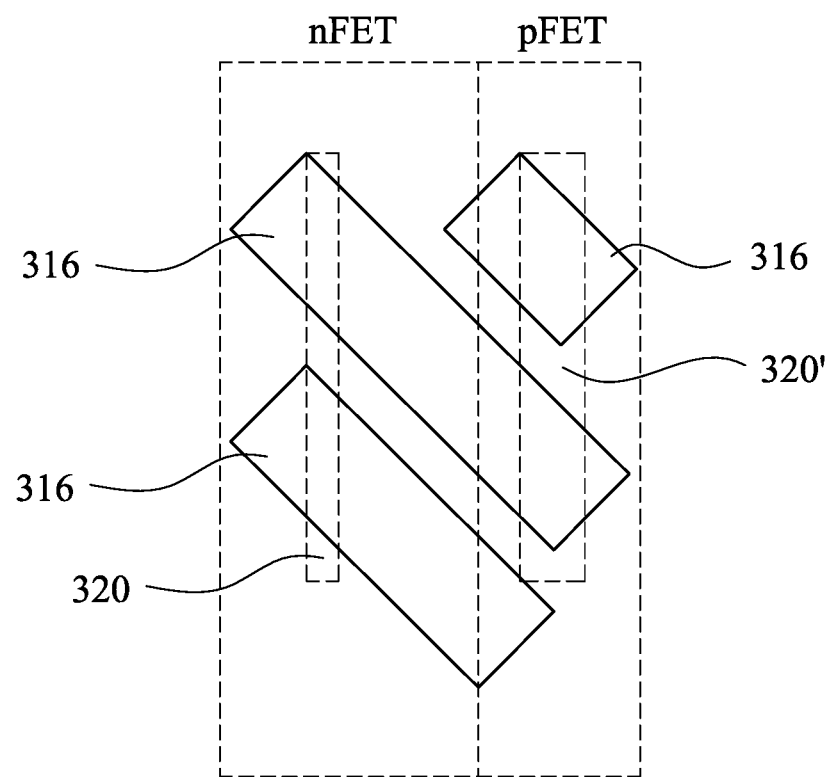
FIGS. 17A-17C depict schematic simplified structure of a semiconductor device.
Figure 17B:
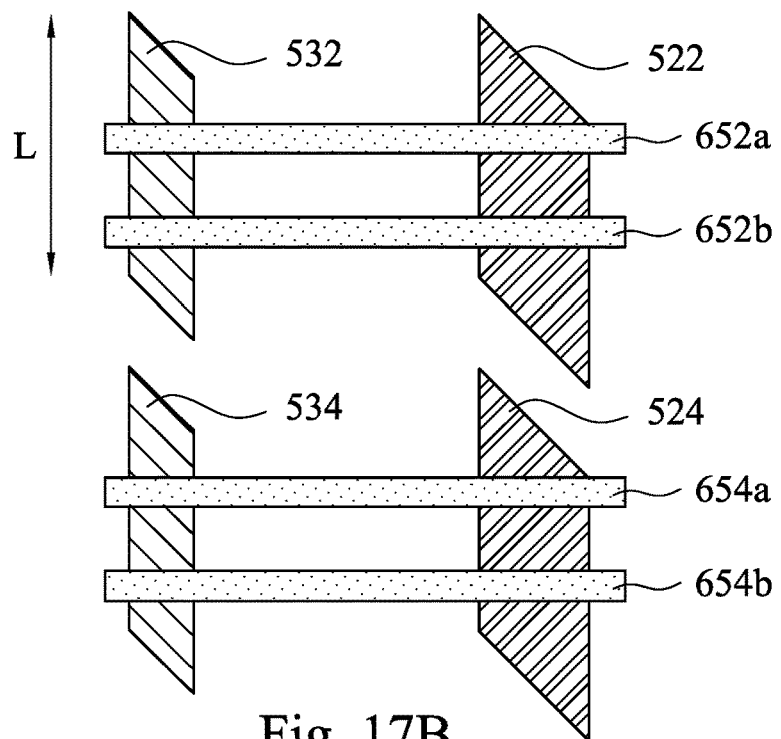
Figure 17C:
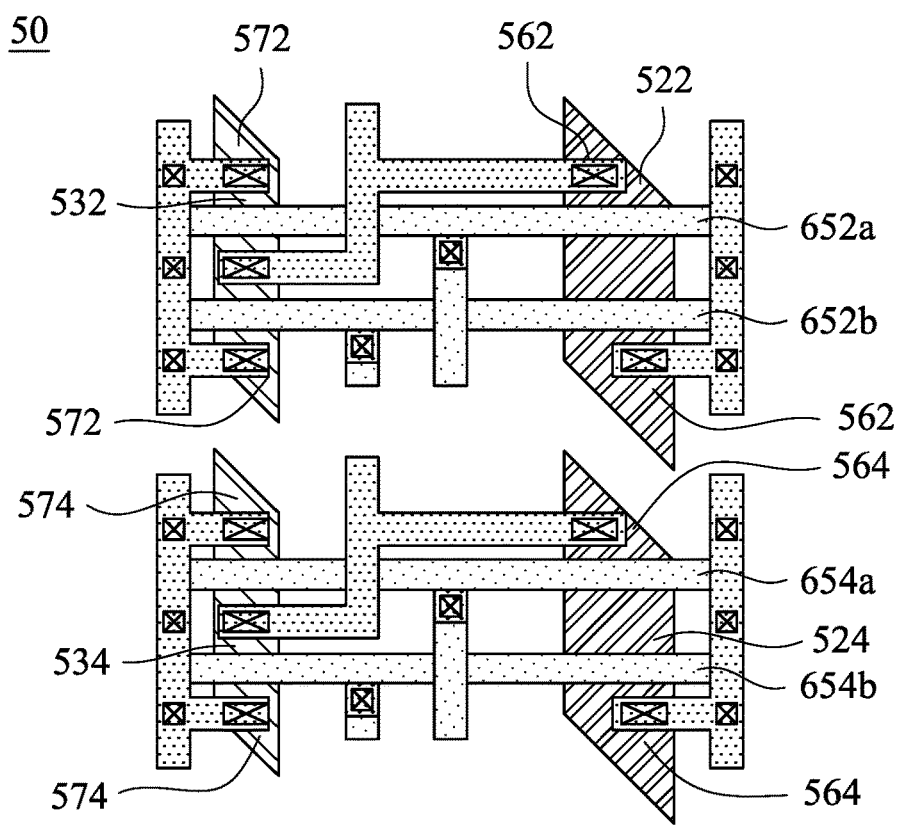

Reference is made to FIGS. 17A through 17C, illustrating the transition from the patterned epitaxial layers to two NANDs 50. FIG. 17A is a schematic diagram showing the relationship between the trenches 316 and the hard masks 320 and 320'. In some embodiments, an n-FET and a p-FET regions are arranged side by side as shown in FIG. 17A. Each of the hard masks 320 and 320' spans across two of the trenches 316, and therefore creating four semiconductor fins, two for each of the n-FET and p-FET regions. The two n-FETs and two p-FETs are made into two NANDs 50. The hard mask 320' is different from the hard mask 320. The hard mask 320' is broader in width than the hard mask 320. The resulting patterned epitaxial layer from the hard mask 320' is measured wider than the neighbouring patterned epitaxial layer which uses had mask 320 as a template. The varied configuration of hard masks results in different patterned epitaxial layers. In some embodiments, the hard masks may have different width as shown in FIG. 17A. In some embodiments, the hard masks may have different length. In some embodiments, the width and length of the hard masks may both be different from each other. The hard masks may have variation in dimension and maintain the resulting patterned epitaxial layers toward the <110> crystallographic direction at the same time. It should be understood that hard mask variation in dimension does not interrupt the alignment among the patterned epitaxial layers. As shown in FIG. 17A, the resulting patterned epitaxial layers will be in alignment in row and in column regardless the width.

Reference is made to FIG. 17B, illustrating a schematic diagram of the n-FETs and p-FETs. Two sets of neighbouring semiconductor fins are yielded after the patterning process shown in FIG. 17A. The semiconductor fins (patterned epitaxial layers) are orientated to the <110> crystallographic direction suitable for subsequent fabrication process. The semiconductor fins 522 and 524 are originated from the hard mask 320' at the p-FET region, and the semiconductor fins 532 and 534 are originated from the hard mask 320 at the n-FET region. The semiconductor fins 522 and 524 are arranged along the <110> crystallographic direction, and the semiconductor fins 532 and 534 are arranged along the <110> crystallographic direction. The semiconductor fins 532 and 524 are arranged along the <100> crystallographic direction. That is, the semiconductor fins 532 and 524 are patterned from the same strip of the semiconductor pillar 312 (see FIG. 4). Gate structures 652a and 652b are formed across the semiconductor fins 522 and 532. Gate structures 654a and 654b are formed across the semiconductor fins 524 and 534. Unlike the inverters shown in FIG. 14B, each pair of the n-FET and p-FET regions has two gate structures. The number of gate structures disposed on the semiconductor fins (patterned epitaxial layers) 522, 524, 532, and 534 is flexible depending on design choice. As shown in FIG. 17B, the semiconductor fins 522 and 532 accommodate two gate structures 652a and 652b making two pairs of neighbouring p-FinFETs and n-FinFETs. The semiconductor fins 524 and 534 accommodate two gate structures 654a and 654b making two pairs of neighbouring p-FinFETs and n-FinFETs. The gate structures 652a, 652b, 654a, and 654b may be formed by gate first or gate last process.

Reference is made to FIG. 17C. Source and drain regions 562, 564, 572, and 574 are formed. The source and drain regions 562, 564, 572, and 574 are formed on either side of the semiconductor fins 522, 524, 532, and 534. Contact plugs are designated as a cross with border in FIG. 17C. The contact plugs are electrically connected to the source and drain regions 562, 564, 572, and 574 and the gate structures 652a, 652b, 654a, and 654b. The semiconductor fins (patterned epitaxial layers) 522, 524, 532, and 534 are then transformed into two adjacent NANDs 50, and their n-FinFET and p-FinFET regions are of different dimensions.

When epitaxial layer is grown inside a <100> crystallographic direction predefined trenches with high aspect ratio on silicon substrate, all four of the <111> family threading dislocations will be trapped within the trench sidewalls, leaving the top portion defect-free. This aspect-ratio-trapping (ART) technique utilizes geometrical defect annihilation technique. The semiconductor fins are then transformed from <100> crystallographic direction to the industrial standard <110> crystallographic direction by photolithography and patterning process. The transformation allows the semiconductor fins to remain defect free and to be easily handled.

According to some embodiments, a method of manufacturing a semiconductor device includes forming an isolation region on a semiconductor substrate. A trench is formed in an <xyz> crystallographic direction of the semiconductor substrate in the isolation region. An epitaxial layer is grown in the trench. The epitaxial layer is patterned to form a semiconductor fin orientated along an <x'y'z'> crystallographic direction of the semiconductor substrate, wherein <x'y'z'>≠<xyz>.

In some embodiments, forming the trench in <xyz> crystallographic direction in the isolation region includes forming a semiconductor pillar on the semiconductor substrate. The semiconductor pillar is orientated along the <xyz> crystallographic direction. An isolation layer is deposited on the semiconductor substrate and around the semiconductor pillar to form the isolation region. The semiconductor pillar is removed to form the trench.

In some embodiments, the method further includes forming a hard mask over the epitaxial layer before patterning the epitaxial layer, wherein the hard mask is orientated along the <x'y'z'> crystallographic direction.

In some embodiments, patterning the epitaxial layer includes removing portions of the epitaxial layer in the trench according to the hard mask to form the semiconductor fin.

In some embodiments, the method further includes filling the remaining trench with a dielectric material. The isolation region and the dielectric material are recessed to expose an upper portion of the semiconductor fin.

In some embodiments, <xyz> is <100>, and <x'y'z'> is <110>.

In some embodiments, the method further includes forming a gate structure over the semiconductor fin. A source and drain region are formed in the semiconductor fin and on a side of the gate structure.

In some embodiments, the semiconductor substrate and the epitaxial layer have different materials.

In some embodiments, an etching selectivity exists between the epitaxial layer and the isolation region.

According to some embodiments, a method of manufacturing a semiconductor device includes forming an epitaxial layer over a semiconductor substrate, wherein the epitaxial layer is orientated along <100> crystallographic direction. A hard mask is formed over the epitaxial layer. The hard mask is orientated along a <110> crystallographic direction. The epitaxial layer is patterned according to the hard mask to form a semiconductor fin.

In some embodiments, the method further includes removing the hard mask after patterning the epitaxial layer. A gate structure is formed over the semiconductor fin after removing the hard mask.

In some embodiments, the method further includes forming an isolation region on the semiconductor substrate, and the epitaxial layer is formed in the isolation region.

According to some embodiments, a semiconductor device includes a plurality of semiconductor fins and a gate structure. The semiconductor fins have parallelogram top surfaces, the parallelogram top surface has two acute interior angles and two obtuse interior angles. The gate structure is over at least one of the semiconductor fins.

In some embodiments, two of the semiconductor fins are arranged along <110> crystallographic direction, and two of the semiconductor fins are arranged along <100> crystallographic direction.

In some embodiments, the two semiconductor fins arranged along <110> crystallographic direction have the same type dopants, and the two semiconductor fins arranged along <100> crystallographic direction have different type dopants.

In some embodiments, the two semiconductor fins arranged along <110> crystallographic direction have the same width, and the two semiconductor fins arranged along <100> crystallographic direction have different widths.

In some embodiments, the semiconductor device further includes a semiconductor substrate under the semiconductor fins. An interface of one of the semiconductor fins and the semiconductor substrate is parallelogram, and the interface has two acute internal angles and two obtuse internal angles.

In some embodiments, at least one of the semiconductor fins has source/drain regions and a channel region between the source/drain regions, the gate structure is over the channel region, and at least one of the source/drain regions has a tapered end tapered away from the channel region.

In some embodiments, a sidewall and an end wall of the at least one semiconductor fin form the tapered end.

In some embodiments, the semiconductor substrate and the semiconductor fin have different materials.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, the method comprising:
    forming an isolation region on a top surface of a semiconductor substrate;
    forming a trench in an <xyz> crystallographic direction of the semiconductor substrate in the isolation region;
    growing an epitaxial layer in the trench; and
    patterning the epitaxial layer to form a semiconductor fin orientated along an <x' y' z'> crystallographic direction of the semiconductor substrate, wherein the <xyz> crystallographic direction and the <x' y' z'> crystallographic direction are substantially parallel to the top surface of the semiconductor substrate, and <x' y' z'>≠<xyz>.

2. The method of claim 1, wherein forming the trench in <xyz> crystallographic direction in the isolation region comprises:
    forming a semiconductor pillar on the semiconductor substrate, wherein the semiconductor pillar is orientated along the <xyz> crystallographic direction;
    depositing an isolation layer on the semiconductor substrate and around the semiconductor pillar to form the isolation region; and
    removing the semiconductor pillar to form the trench.

3. The method of claim 1, further comprising forming a hard mask over the epitaxial layer before patterning the epitaxial layer, wherein the hard mask is orientated along the <x'y'z'> crystallographic direction.

4. The method of claim 3, wherein patterning the epitaxial layer comprises:
    removing portions of the epitaxial layer in the trench according to the hard mask to form the semiconductor fin.

5. The method of claim 4, further comprising:
    filling the remaining trench with a dielectric material; and
    recessing the isolation region and the dielectric material to expose an upper portion of the semiconductor fin.

6. The method of claim 1, wherein <xyz> is <100>, and <x'y'z'> is <110>.

7. The method of claim 1, further comprising:
    forming a gate structure over the semiconductor fin; and
    forming a source and drain region in the semiconductor fin and on a side of the gate structure.

8. The method of claim 1, wherein the semiconductor substrate and the epitaxial layer have different materials.

9. The method of claim 1, wherein an etching selectivity exists between the epitaxial layer and the isolation region.

10. A method of manufacturing a semiconductor device, the method comprising:
    forming an epitaxial layer over a semiconductor substrate, wherein the epitaxial layer is orientated along <100> crystallographic direction;

forming a hard mask over the epitaxial layer, wherein the hard mask is orientated along a <110> crystallographic direction; and patterning the epitaxial layer according to the hard mask to form a semiconductor fin.

11. The method of claim 10, further comprising:

removing the hard mask after patterning the epitaxial layer; and forming a gate structure over the semiconductor fin after removing the hard mask.

12. The method of claim 10, further comprising:

forming an isolation region on the semiconductor substrate, and the epitaxial layer is formed in the isolation region.

13. The method of claim 12, wherein forming the hard mask is performed such that the hard mask is over the epitaxial layer and the isolation region.

14. A method, comprising:

forming a trench in a dielectric layer over a semiconductive substrate;

growing an epitaxial structure in the trench;

etching the epitaxial structure to form a semiconductive fin, wherein etching the epitaxial structure is performed such that the semiconductive fin has a top surface that has a first edge, a second edge substantially parallel with the first edge, and a third edge obliquely connected between the first edge and the second edge; and recessing the dielectric layer to expose an upper portion of the semiconductive fin.

15. The method of claim 14, wherein the first edge and the second edge of the top surface of the semiconductive fin extend in a <100> crystallographic direction, and the third edge of the top surface of the semiconductive fin extends in a <110> crystallographic direction.

16. The method of claim 14, wherein etching the epitaxial structure is performed such that the first edge and the second edge of the top surface of the semiconductive fin are connected with the dielectric layer, and the third edge of the top surface of the semiconductive fin is spaced apart from the dielectric layer.

17. The method of claim 14, wherein etching the epitaxial structure is performed such that a portion of the epitaxial structure in the trench is removed.

18. The method of claim 14, further comprising:

forming a gate structure over the upper portion of the semiconductive fin after recessing the dielectric layer.

19. The method of claim 18, wherein forming the gate structure is performed such that the gate structure is orientated along a direction orthogonal to the first edge and the second edge of the top surface of the semiconductive fin.

20. The method of claim 18, further comprising:

forming a source and drain region in the upper portion of the semiconductive fin and on a side of the gate structure.

* * * * *